United States Patent
Yamashita

(10) Patent No.: US 10,933,631 B2
(45) Date of Patent: Mar. 2, 2021

(54) INK-JET HEAD DRIVING CIRCUIT AND INK-JET PRINTER WITH INK-JET HEAD DRIVING CIRCUIT

(71) Applicant: BROTHER KOGYO KABUSHIKI KAISHA, Nagoya (JP)

(72) Inventor: Toru Yamashita, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

(21) Appl. No.: 16/397,527

(22) Filed: Apr. 29, 2019

(65) Prior Publication Data
US 2019/0255838 A1 Aug. 22, 2019

Related U.S. Application Data

(62) Division of application No. 15/469,927, filed on Mar. 27, 2017, now Pat. No. 10,315,416.

(30) Foreign Application Priority Data

Mar. 31, 2016 (JP) .................................. 2016-073015

(51) Int. Cl.
*B41J 2/045* (2006.01)
*H01L 41/04* (2006.01)

(52) U.S. Cl.
CPC ......... *B41J 2/0455* (2013.01); *B41J 2/04511* (2013.01); *B41J 2/04513* (2013.01);
(Continued)

(58) Field of Classification Search
CPC .. B41J 2/04541; B41J 2/04548; B41J 2/0455; B41J 2/04581; H01L 41/042
See application file for complete search history.

(56) References Cited

U.S. PATENT DOCUMENTS

| 4,385,947 A | 5/1983 | Halfacre |
| 5,838,047 A | 11/1998 | Yamauchi et al. |

(Continued)

FOREIGN PATENT DOCUMENTS

| JP | H09-8645 A | 1/1997 |
| JP | 2004-050492 A | 2/2004 |

(Continued)

OTHER PUBLICATIONS

Notice of Reasons for Refusal dated Feb. 4, 2020 received in Japanese Patent Application No. JP 2016-073015 together with an English language translation.

(Continued)

*Primary Examiner* — Matthew Luu
*Assistant Examiner* — Kendrick X Liu
(74) *Attorney, Agent, or Firm* — Scully Scott Murphy and Presser

(57) ABSTRACT

An ink-jet head driving circuit includes: PMOS transistors each of which has an Nwell area, a drain terminal and a source terminal, the PMOS transistors connected to a piezoelectric element for jetting ink from a nozzle; and an NMOS transistor connected to the drain terminals of the PMOS transistors. The source terminals and Nwell areas of the PMOS transistors are connected respectively to power sources, and voltage of one of the power sources connected to the Nwell area of each of the PMOS transistors is equal to or higher than the highest voltage of the power sources connected to the source terminals of the PMOS transistors.

5 Claims, 9 Drawing Sheets

(52) U.S. Cl.
CPC ....... *B41J 2/04541* (2013.01); *B41J 2/04548* (2013.01); *B41J 2/04581* (2013.01); *H01L 41/042* (2013.01)

(56) References Cited

U.S. PATENT DOCUMENTS

| | | | |
|---|---|---|---|
| 6,838,328 B1* | 1/2005 | Burr | H01L 21/761 257/E21.544 |
| 2006/0039206 A1 | 2/2006 | Taniguchi et al. | |
| 2007/0076026 A1 | 4/2007 | Nakayama | |
| 2010/0007704 A1* | 1/2010 | Nitta | B41J 2/04506 347/68 |
| 2015/0251415 A1 | 9/2015 | Takagi | |
| 2016/0271938 A1 | 9/2016 | Abe | |

FOREIGN PATENT DOCUMENTS

| | | | |
|---|---|---|---|
| JP | 2004-153411 A | | 5/2004 |
| JP | 2004153411 A | * | 5/2004 |
| JP | 2006-68991 A | | 3/2006 |
| JP | 2007-098795 A | | 4/2007 |
| JP | 2010-018028 A | | 1/2010 |
| JP | 2013-010227 A | | 1/2013 |
| JP | 2015-30144 A | | 2/2015 |

OTHER PUBLICATIONS

Official Action dated Feb. 25, 2019 received from the Chinese Patent Office in related application CN 201710173224.6 together with an English language translation.
Notice of Allowance dated Jan. 31, 2019 received from the United States Patent Office on related U.S. Appl. No. 15/469,927.
Official Action dated Jul. 4, 2018 received from the Chinese Patent Office in related application CN 201710173224.6 together with an English language translation.
Official Action dated Apr. 19, 2018 received from the United States Patent Office on related U.S. Appl. No. 15/469,927.
Extended European Search Report dated Aug. 24, 2017 from related EP 17163388.6.
Notice of Reasons for Refusal dated May 19, 2020 received in Japanese Patent Application No. JP 2016-073015 together with an English language translation.
Extended European search report dated Dec. 10, 2020 received in European Patent Application No. EP 20192542.7.

* cited by examiner

INK-JET HEAD DRIVING CIRCUIT AND INK-JET PRINTER WITH INK-JET HEAD DRIVING CIRCUIT

CROSS REFERENCE TO RELATED APPLICATION

This application is a divisional application of U.S. application Ser. No. 15/469,927 filed on Mar. 27, 2017, which claims priority from Japanese Patent Application No. 2016-073015 filed on Mar. 31, 2016, the disclosure of which is incorporated herein by reference in its entirety.

FIELD OF THE INVENTION

The present invention relates to an ink-jet head driving circuit and an ink-jet printer with the ink-jet head driving circuit. The ink-jet head driving circuit is for controlling driving of nozzles of an ink-jet head.

DESCRIPTION OF THE RELATED ART

In recent years, such printers are used as to use an ink-jet head in which a large number of nozzles are densely arranged so as to realize high image quality and enable high speed printing.

Conventionally, such ink-jet head driving circuits for ink-jet heads are proposed as to use CMOS circuits for charging and discharging piezoelectric elements as capacitance members. A CMOS circuit includes an NMOS transistor and a PMOS transistor. An Nwell area is connected with a power source having a higher voltage than the power supply voltage connected to the source of the PMOS transistor for preventing reversed electric current in the Nwell area from the drain of the PMOS transistor at the time of discharging from the piezoelectric elements.

SUMMARY

The piezoelectric elements are provided respectively for a plurality of nozzles. The properties of the piezoelectric elements (such as the displacements thereof when a predetermined voltage is applied) are different according to each of the piezoelectric elements. Hence, in order to uniformize the jetting amounts and jetting speeds of inks from the plurality of nozzles, it is conceivable to use a plurality of power sources capable of applying different voltages to one piezoelectric element.

However, when a plurality of power sources are used for a piezoelectric element, the CMOS circuit includes one NMOS transistor and a plurality of PMOS transistors. If the plurality of PMOS transistors is provided respectively with high voltage power sources for preventing the reversed current, then the configuration becomes complicated and, furthermore, the manufacturing cost increases.

The present teaching is made in view of the above situation, and an object thereof is to provide an ink-jet head driving circuit capable of providing high voltage power sources of a simple configuration for preventing the reversed current when a plurality of PMOS transistors are connected to a plurality of power sources having different voltages, thereby allowing for suppressing the manufacturing cost.

DESCRIPTION OF THE EMBODIMENTS

First Embodiment

An ink-jet printer according to a first embodiment will be explained below based on the accompanying drawings.

Figure 1:
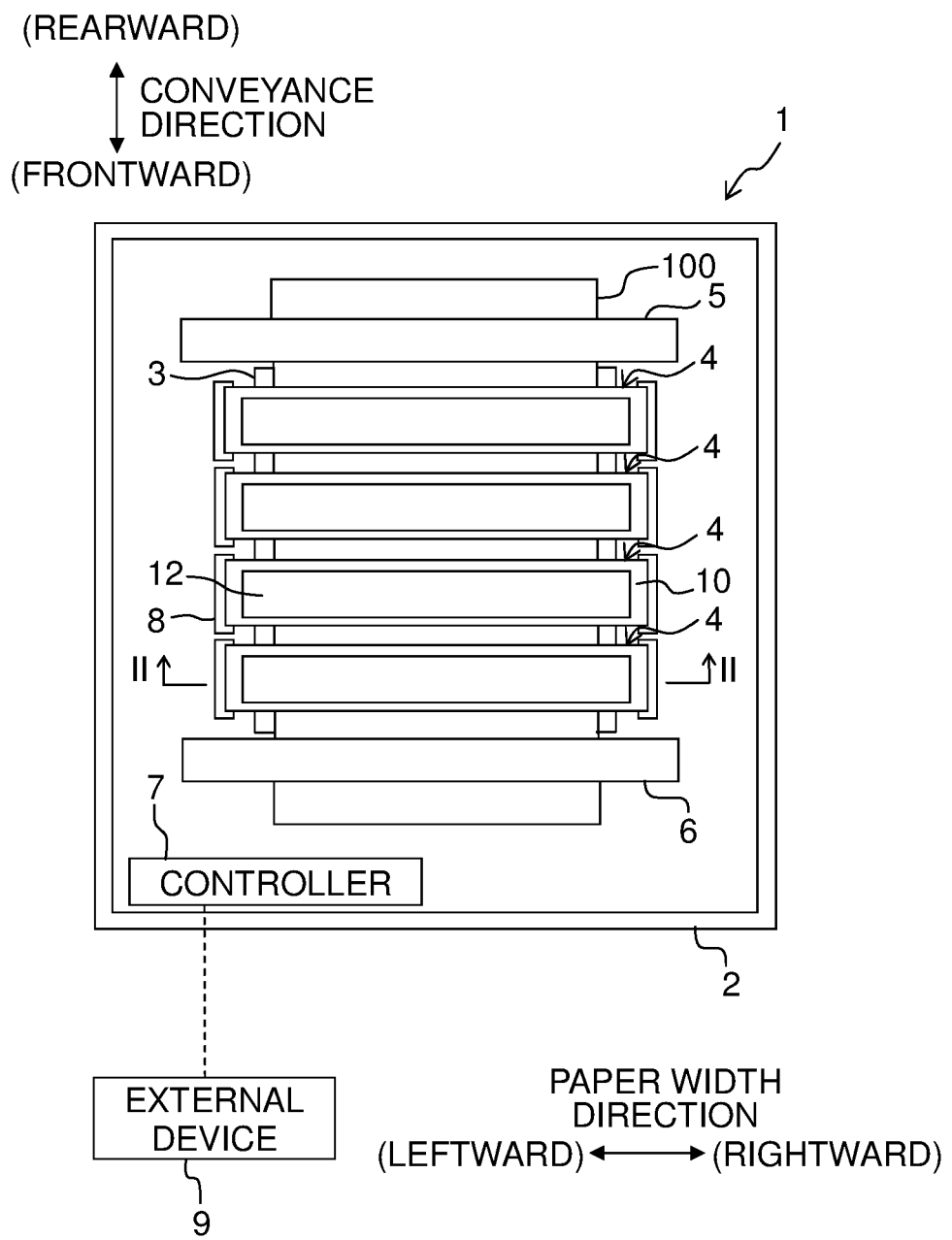
FIG. 1 is a plan view schematically depicting an ink-jet printer according to a first embodiment of the present teaching.

In FIG. 1, the front side of a printer 1 is defined on the downstream side in a conveyance direction of recording paper 100, whereas the rear side of the printer 1 is defined on the upstream side in the conveyance direction. Further, the left-right direction of the printer 1 is defined in such a direction along the paper width as is parallel to the conveyance plane of the recording paper 100 (the plane parallel to the page of FIG. 1) and is orthogonal to the conveyance direction. Further, the left side of FIG. 1 is the left side of the printer 1 whereas the right side of FIG. 1 is the right side of the printer 1. Further, the upper-lower or vertical direction of the printer 1 is defined in a direction orthogonal to the conveyance plane of the recording paper 100 (a direction orthogonal to the page of FIG. 1). In FIG. 1, the front side or near side is the upper side whereas the rear side or far side is the lower side. Those defined front, rear, left, right, upper, and lower will be used as appropriate in the following explanation.

As depicted in FIG. 1, the printer 1 includes a case 2, a platen 3, four ink-jet heads 4, two conveyance rollers 5 and 6, and a controller 7.

The platen 3 is placed horizontally in the case 2. The recording paper 100 is placed on the upper surface of the platen 3. The four ink-jet heads 4 are provided above the platen 3 to be juxtaposed in the front-rear direction. The two conveyance rollers 5 and 6 are arranged respectively on the rear side and the front side of the platen 3. The two conveyance rollers 5 and 6 are driven respectively by an undepicted motor to convey the recording paper 100 on the platen 3 to the front side.

The controller 7 includes an FPGA (Field Programmable Gate Array), and the like. Illustration of the FPGA is omitted. Further, instead of the FPGA, a processor such as a CPU (Central Processing Unit) or the like may be used. Further, the controller 7 is connected with an external device 9 such as a PC or the like in a data communicable manner, to control each device of printer 1 based on print data sent from the external device 9.

For example, the controller 7 controls the motor to drive the conveyance rollers 5 and 6 to cause the conveyance rollers 5 and 6 to convey the recording paper 100 in the conveyance direction, while controlling the ink-jet heads 4 to jet inks toward the recording paper 100. By virtue of this, image is printed on the recording paper 100.

Head holders 8 are installed in the case 2. The head holders 8 are arranged above the platen 3 and juxtaposed between the conveyance rollers 5 and 6 in the front-rear direction. The head holders 8 hold the ink-jet heads 4 respectively.

The four ink-jet heads 4 jet the inks of four colors: cyan (C), magenta (M), yellow (y), and black (K), respectively. Each of the ink-jet heads 4 is supplied with the ink of the corresponding color from an undepicted ink tank.

Figure 2:
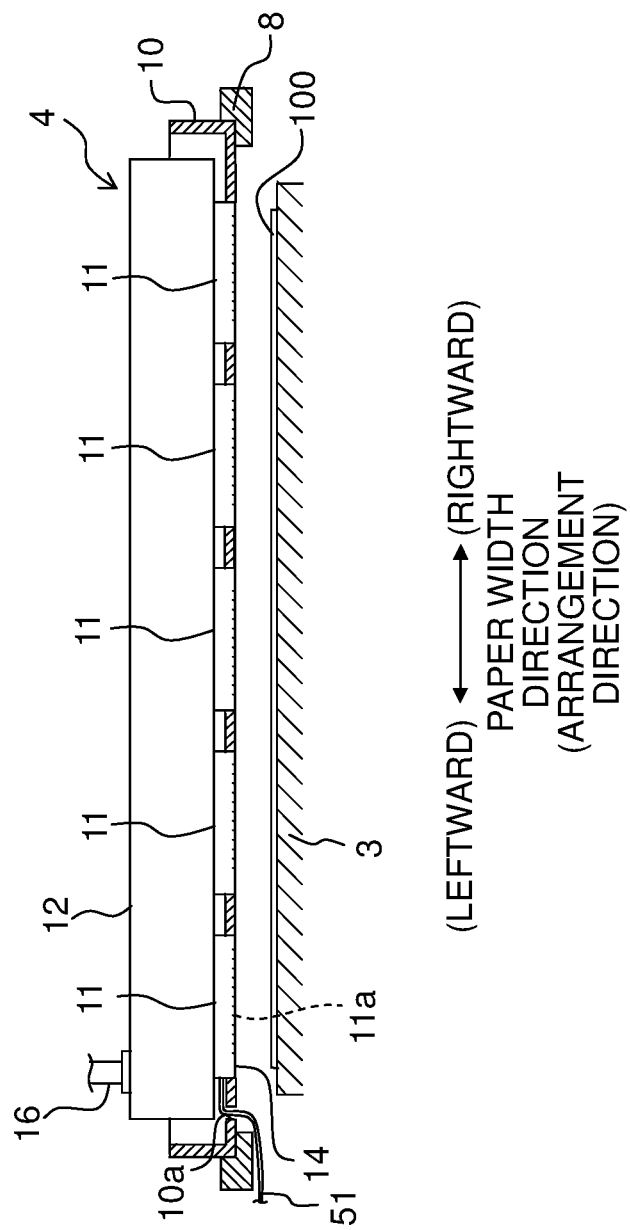
FIG. 2 is a schematic cross-sectional view taken along the line II-II depicted in FIG. 1.
Figure 3:
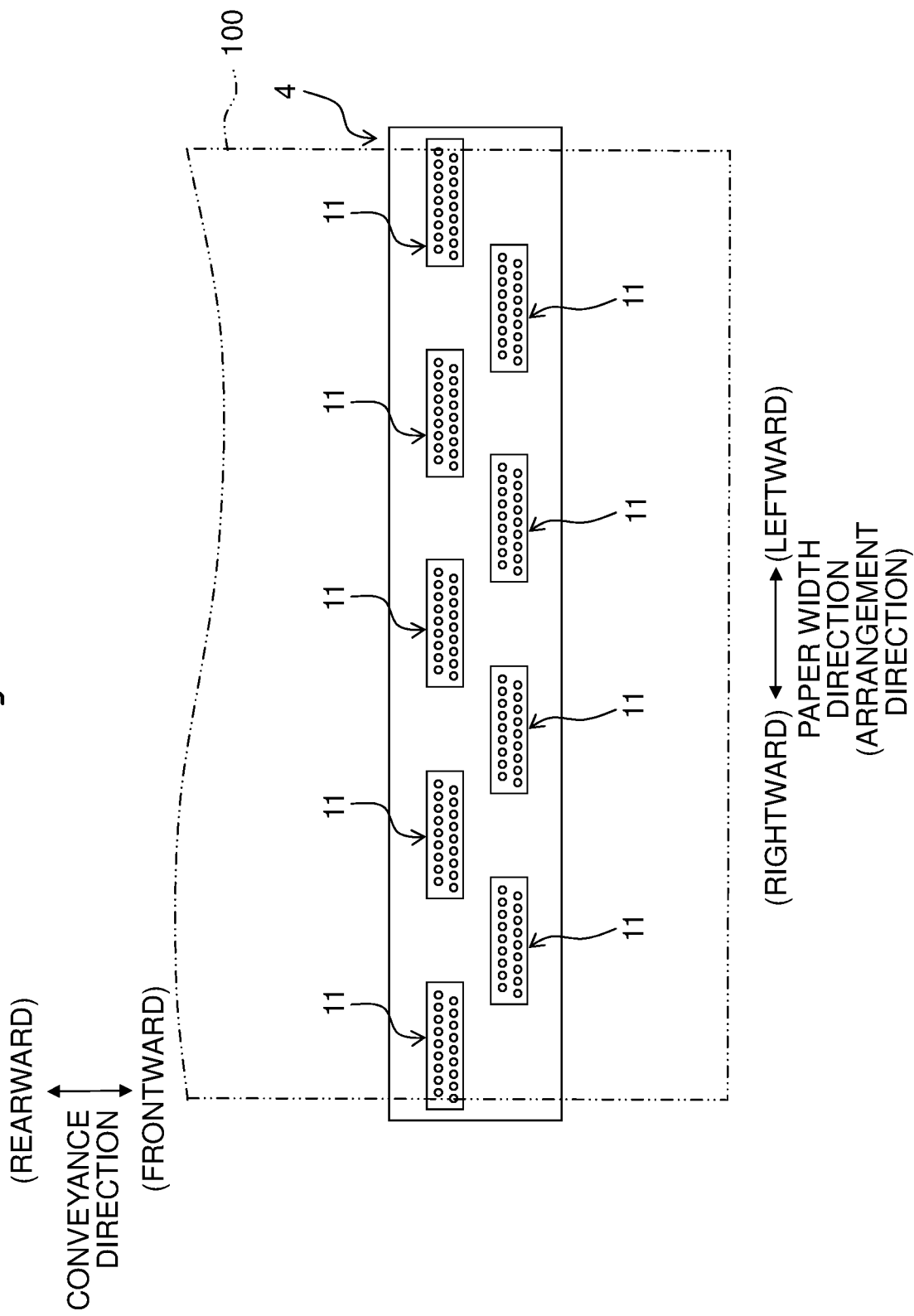
FIG. 3 is a bottom plan view of an ink-jet head.
Figure 4:
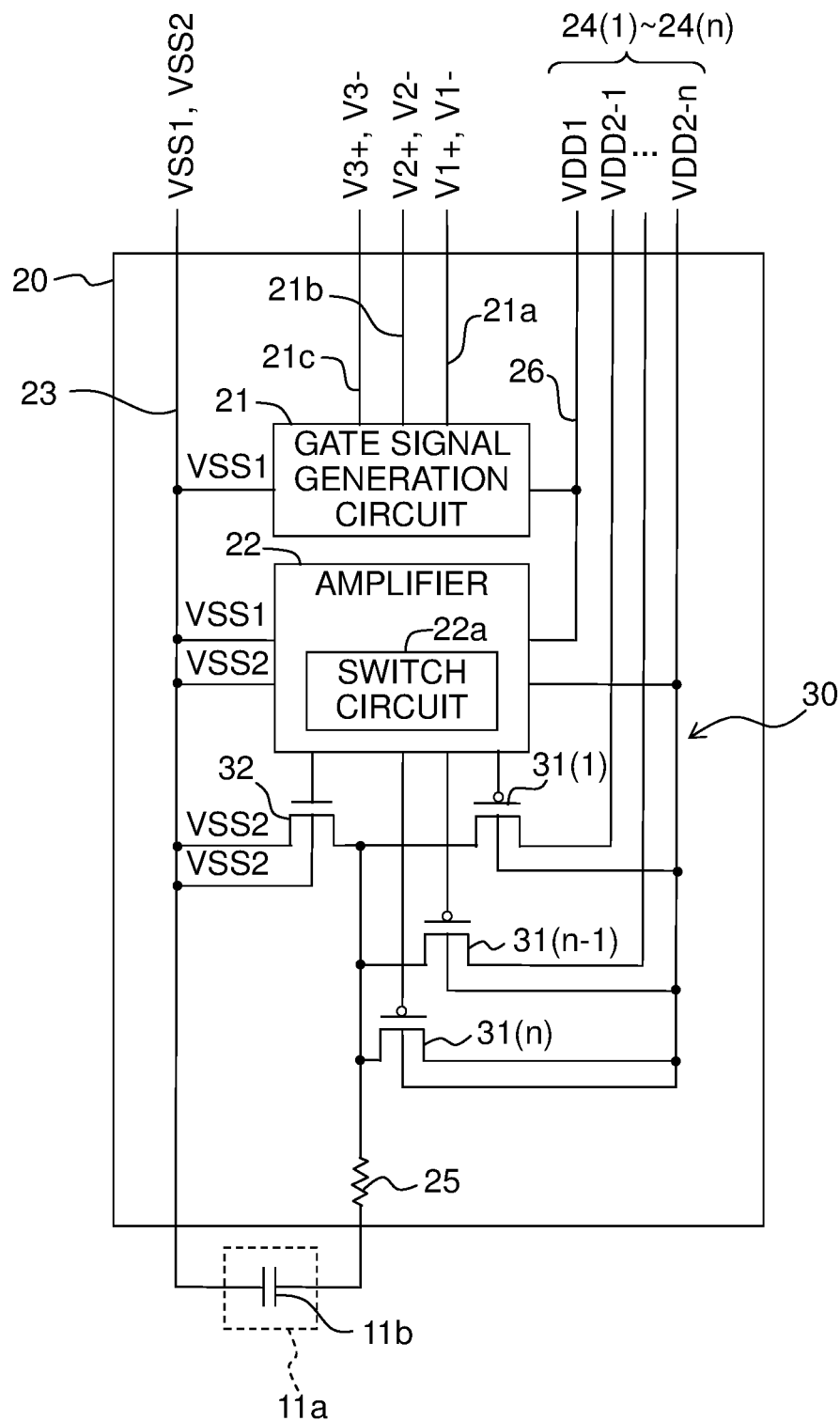
FIG. 4 is a circuit diagram schematically depicting an ink-jet head driving circuit.
Figure 5:
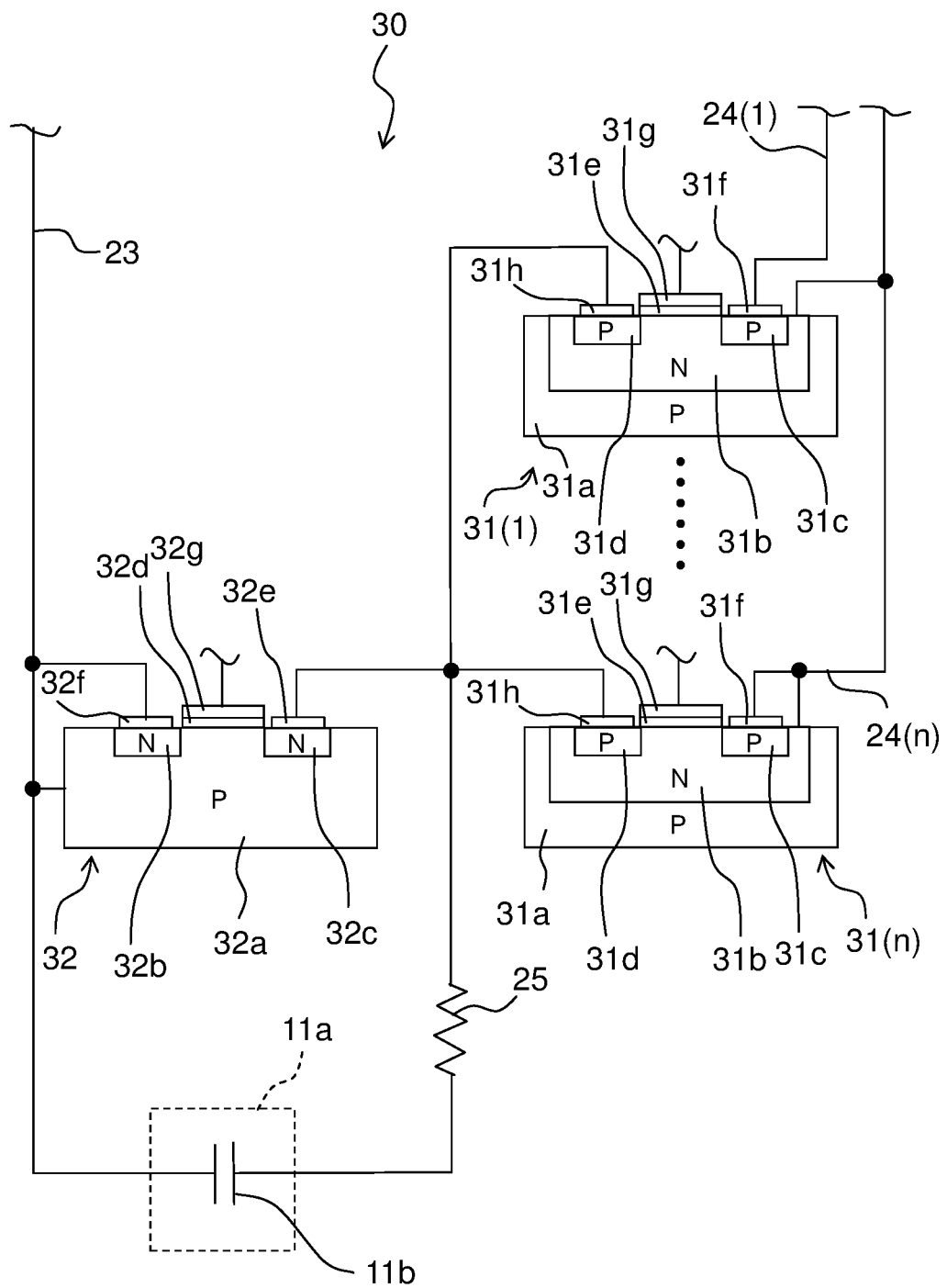
FIG. 5 is a partial circuit diagram schematically depicting a configuration of a CMOS circuit.

As depicted in FIGS. 2 and 3, each of the ink-jet heads 4 includes a holder 10 in a rectangular plate-like shape elongated in the paper width direction, and head units 11 attached to the holder 10. Nozzles 11a are formed in the lower surface of each of the head units 11.

As depicted in FIG. 2, the holder 10 is provided with a slit 10a. A flexible substrate 51 connects the head units 11 and the controller 7, and the flexible substrate 51 is inserted through the slit 10a.

The head units 11 are arranged to align in a staggered form along an arrangement direction and along the conveyance direction. Further, the head units 11 may be arranged obliquely, that is, along a direction intersecting the conveyance direction at an angle other than 90 degrees.

As depicted in FIGS. 1 and 2, a reservoir 12 is provided above the plurality of head units 11. An illustration of the reservoir 12 is omitted in FIG. 3.

The reservoir 12 is connected to one of the ink tanks (not depicted) via a tube 16 to temporarily retain the ink supplied from the ink tank. The reservoir 12 has a lower portion connected to the head units 11 to supply each of the head units 11 with the ink from the reservoir 12.

Each of the head units 11 includes nozzles 11a and piezoelectric elements 11b. Each of the piezoelectric elements 11b is constructed of, for example, a piezoelectric body, and is driven by way of applying a voltage thereto. The controller 7 includes an ink-jet head driving circuit 20 to drive the piezoelectric elements 11b of the head unit 11. Each of the piezoelectric elements 11b functions as a capacitor in the ink-jet head driving circuit 20.

The ink-jet head driving circuit 20 includes a gate signal generation circuit 21, an amplifier 22, a CMOS (Complementary Metal-Oxide-Semiconductor) circuit 30, an impedance 25, and the like. The CMOS circuit 30 includes first PMOS (P-type Metal-Oxide-Semiconductor) transistor 31(1) to nth PMOS transistor 31(n) (n is an integer not less than two), and an NMOS (N-type Metal-Oxide-Semiconductor) transistor 32.

Herein below, if distinction is not necessary, then the first PMOS transistor 31(1) to the nth PMOS transistor 31(n) will be simply referred to as the PMOS transistor 31. The PMOS transistor 31 includes a grounded first P-type area 31a, an Nwell area 31b laid on the first P-type area 31a, a second P-type area 31c and a third P-type area 31d formed separate from each other in the Nwell area 31b, an oxide film 31e formed on the Nwell area 31b and positioned between the second P-type area 31c and the third P-type area 31d, a source terminal 31f and a drain terminal 31h formed of conductive bodies respectively on the second P-type area 31c and the third P-type area 31d, and a gate terminal 31g formed of a conductive body on the oxide film 31e.

The NMOS transistor 32 includes a grounded P-type area 32a, a first N-type area 32b and a second N-type area 32c formed separate from each other in the P-type area 32a, an oxide film 32d formed on the P-type area 32a and positioned between the first N-type area 32b and the second N-type area 32c, a source terminal 32f and a drain terminal 32e formed of conductive bodies respectively on the first N-type area 32b and the second N-type area 32c, and a gate terminal 32g formed of a conductive body on the oxide film 32d.

The ink-jet printer includes undepicted power sources different in voltage, that is, the first power source to the nth power source (n is an integer not less than two). The nth power source is, for example, a power source used for correction of non-jetting if ink is not jetted from a nozzle 11a. The first power source to the nth power source are connected respectively with the source terminals 31f of the first PMOS transistor 31(1) to the nth PMOS transistor 31(n) via a first power wire 24(1) to an nth power wire 24(n) (n is an integer not less than two).

The first power wire 24(1) to the nth power wire 24(n) supply such voltages, that is, the voltages of the first power source to the nth power source, as VDD2-1 to VDD2-n, respectively. The magnitudes of the respective voltages are VDD2-1<VDD2-2< . . . <VDD2-(n−1)<VDD2-n. The Nwell areas 31b of the first PMOS transistor 31(1) to the nth PMOS transistor 31(n) are all connected to the nth power wire 24(n).

At the voltages VDD2-1 to Vdd2-(n−1) of the first power source to the (n−1)th power source, for example, as between the voltage VDD2-1 of the first power source and the voltage VDD2-2 of the second power source, the difference in voltage between two successively numbered power sources (the difference in voltage between a predetermined applying voltage and another applying voltage) is set in the range of a reference voltage difference such as, for example, from 0.5 to 1.0 [V].

On the other hand, the difference between the voltage VDD2-n which is the highest voltage in the first power source to the nth power source and the next highest voltage VDD2-(n−1) to the highest voltage (the second highest voltage) is set in a range of a larger value than the reference voltage difference such as the range from 2.0 to 5.0 [V]. In order to correct non-jetting, that is, to dissolve ink clogging, high energy (high voltage) is needed. Therefore, the power source used for the correction of non-jetting is set at a higher voltage than the other voltages. Hence, the difference between the highest voltage and the second highest voltage is larger than the reference voltage difference between the predetermined applying voltage and another applying voltage.

The gate terminal 31g of the PMOS transistor 31 and the gate terminal 32g of the NMOS transistor 32 are connected respectively with the amplifier 22. The drain terminal 31h of the PMOS transistor 31 and the drain terminal 32e of the NMOS transistor 32 are connected to each other, and connected to one end of the impedance 25.

The wire 23 is at a voltage VSS1 or VSS2 such as at the ground potential. The source terminal 32f of the NMOS transistor 32 and the P-type area 32a are connected to the wire 23. The VSS2 is inputted to the source terminal 32f and the P-type area 32a from the wire 23. The wire 23 is connected to one side of the piezoelectric element 11b serving as the capacitor. The other side of the piezoelectric element 11b is connected to the other end of the impedance 25.

The gate signal generation circuit 21 is connected to the wire 23 and the VSS1 is inputted thereto. The gate signal generation circuit 21 is connected with a first signal wire 21a, a second signal wire 21b, and a third signal wire 21c. Each of the first signal wire 21a, the second signal wire 21b and the third signal wire 21c has two signal wires. The first signal wire 21a is supplied with voltage from V1+ and V1−, the second signal wire 21b is supplied with voltage from V2+ and V2−, and the third signal wire 21c is supplied with voltage from V3+ and V3−. For example, the voltage of the difference between V1+ and V1−, the voltage of the difference between V2+ and V2−, and the voltage of the difference between V3+ and V3− are inputted to the gate signal generation circuit 21. That is, differential input signals are inputted. By inputting the differential input signals to the gate signal generation circuit 21, it is possible to suppress noise impact and to promote the speed-up of processing. V1+ and V1− correspond to the waveform signal (FIRE) for jetting the ink, V2+ and V2− correspond to one signal (SIN) selected from the waveform signals adaptable to each ch, and V3+ and V3− correspond to a reference clock (CLK).

The ink-jet head driving circuit 20 includes a voltage supply wire 26 to supply voltage VDD1. The gate signal generation circuit 21 is connected to the voltage supply wire 26 and the wire 23, uses the voltage VDD1 of the voltage supply wire 26 or VSS1 of the wire 23, and, based on the differential input, outputs an output signal "H" or "L".

The amplifier 22 is connected to the gate terminal 32g of the NMOS transistor 32. Further, via a switch circuit 22a, the amplifier 22 is connected to the gate terminals 31g of the first PMOS transistor 31(1) to the nth PMOS transistor 31(n). The switch circuit 22a switches the connection to any of the gate terminals 31g of the PMOS transistors 31 based on, for example, a command from the FPGA.

The amplifier 22 is connected to the wire 23, the voltage supply wire 26, and the nth power wire 24(n). The VSS1 and the VSS2 are inputted from the wire 23 to the amplifier 22. The output signal of the gate signal generation circuit 21 is inputted to the amplifier 22. The amplifier 22 uses the voltage VSS1 of the wire 23, the voltage VDD1 of the voltage supply wire 26, and the voltage VDD2-n of the nth power wire 24(n), to amplify the inputted signal and outputs the same to the gate terminal 32g of the NMOS transistor 32, and the gate terminal 31g of any of the first PMOS transistor 31(1) to the nth PMOS transistor 31(n). Further, the amplifier 22 is configured to suppress amplification of noise when amplifying the input signal.

If the output signal "L" is inputted from the amplifier 22 to the gate terminals 31g and 32g of the PMOS transistor 31 and the NMOS transistor 32, then the PMOS transistor 31 is conducted to charge the piezoelectric element 11b. If the output signal "H" is inputted from the amplifier 22 to the gate terminals 31g and 32g of the PMOS transistor 31 and the NMOS transistor 32, then the NMOS transistor 32 is conducted to discharge the piezoelectric element 11b. By charging and discharging the piezoelectric element 11b, the piezoelectric element 11b is deformed to jet the ink from the nozzle 11a.

As described above, the Nwell areas 31b of the first PMOS transistor 31(1) to the nth PMOS transistor 31(n) are all connected to the nth power wire 24(n). That is, among the voltages VDD2-1 to VDD2-n of the first power source to the nth power source, the highest voltage VDD2-n is applied to all of the Nwell areas 31b of the first PMOS transistor 31(1) to the nth PMOS transistor 31(n).

Effects of the first embodiment will be explained below.

Figure 6:
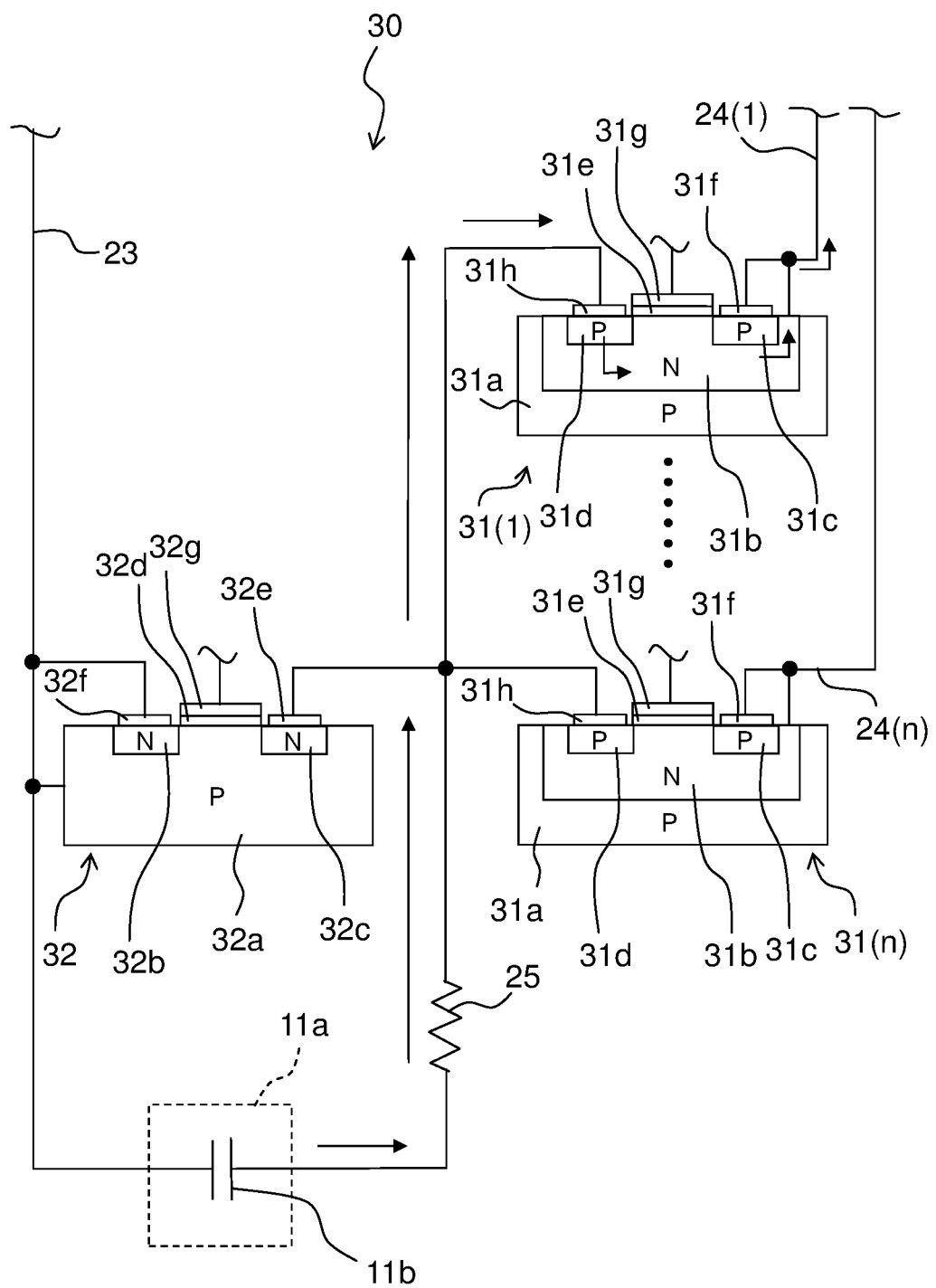
FIG. 6 is another partial circuit diagram schematically depicting the configuration of the CMOS circuit when respectively connecting a first power source to an nth power source with Nwell areas of a first PMOS transistor to an nth PMOS transistor.

As depicted in FIG. 6, in the case of connecting the first power source to the nth power source respectively to the Nwell areas 31b of the first PMOS transistor 31(1) to the nth PMOS transistor 31(n), if the switch circuit 22a switches the connection to the gate terminal 31g of the nth PMOS transistor 31(n), then the piezoelectric element 11b is charged at the voltage VDD2-n.

Thereafter, if the switch circuit 22a switches the connection to another PMOS transistor 31 than the nth PMOS transistor 31(n) such as the first PMOS transistor 31(1) for example, then the voltage VDD2-1 lower than the voltage of the piezoelectric element 11b (the voltage VDD2-n) is applied to the Nwell area 31b of the first PMOS transistor 31(1). Hence, as depicted by the arrows in FIG. 6, the current flows reversely from the piezoelectric element 11b to the first PMOS transistor 31(1). As a result, the first PMOS transistor 31(1) is liable to destruction.

On the other hand, in the first embodiment, among the voltages VDD2-1 to VDD2-n of the first power source to the nth power source, the highest voltage VDD2-n is applied to all of the Nwell areas 31b of the first PMOS transistor 31(1) to the nth PMOS transistor 31(n). The highest voltage is equal to or higher than the voltage of the piezoelectric element 11b and, because the highest voltage is connected to all of the Nwell areas, the abovementioned current does not flow reversely. Thereby, it is possible to prevent destruction of the ink-jet head driving circuit 20.

In the first embodiment, the common highest voltage is applied to all of the Nwell areas 31b of the PMOS transistors 31. By virtue of this, the current is prevented from flowing reversely from the drain terminal 31h of the PMOS transistor 31 to the Nwell area 31b, with a simpler configuration than the case of providing high voltage power sources respectively for the PMOS transistors for preventing the reversed current.

If each PMOS transistor is provided with a power source to apply voltage equal to or higher than the VDD2-n, then another six power sources are needed (as with the number of PMOS transistors) for preventing the reversed current, in addition to the power sources (for example six power sources) to apply the voltages to the piezoelectric elements. Thus, there will be a significant increase in manufacturing cost. In the first embodiment, however, because the power source applying the voltage equal to or higher than the VDD2-n is connected commonly to the Nwell areas, it is possible to have a smaller number of power sources than the case of providing each PMOS transistor with a power source. Therefore, it is possible to reduce the manufacturing cost and downsize the device. In the first embodiment, the power source for applying the existing highest voltage is connected to all of the Nwell areas. Therefore, it is not necessary to provide other power sources for preventing the reversed current, and thus it is possible to realize reduction of the manufacturing cost and downsizing of the device.

Further, the voltage difference between the highest voltage and the second highest voltage is larger than the reference voltage difference, and the power source having the highest voltage (for example, the power source for the correction of non-jetting) is used for preventing the reversed current. For dissolving the ink clogging, the voltage difference between the power source for the correction of non-jetting and the other power sources is larger than the voltage difference between those other power sources. The power source for the correction of non-jetting is connected to the Nwell areas 31b so as to prevent the reversed current by utilizing the larger voltage difference. Hence, without providing additional power sources, it is still possible to reliably dissolve the ink clogging and also solve the problem of reversed current.

Further, by inputting the signal based on the differential input signal to the PMOS transistor 31 and the NMOS transistor 32, it is possible to eliminate noises from the input signal and, furthermore, promote the speed-up of processing, thereby raising the operating speed of the ink-jet head driving circuit.

Second Embodiment

An ink-jet printer according to a second embodiment will be explained below based on the accompanying drawings. In the configuration of the second embodiment, the components identical or similar to those in the first embodiment are each assigned with the same reference sign, and any detailed explanation therefor will be omitted.

Figure 7:
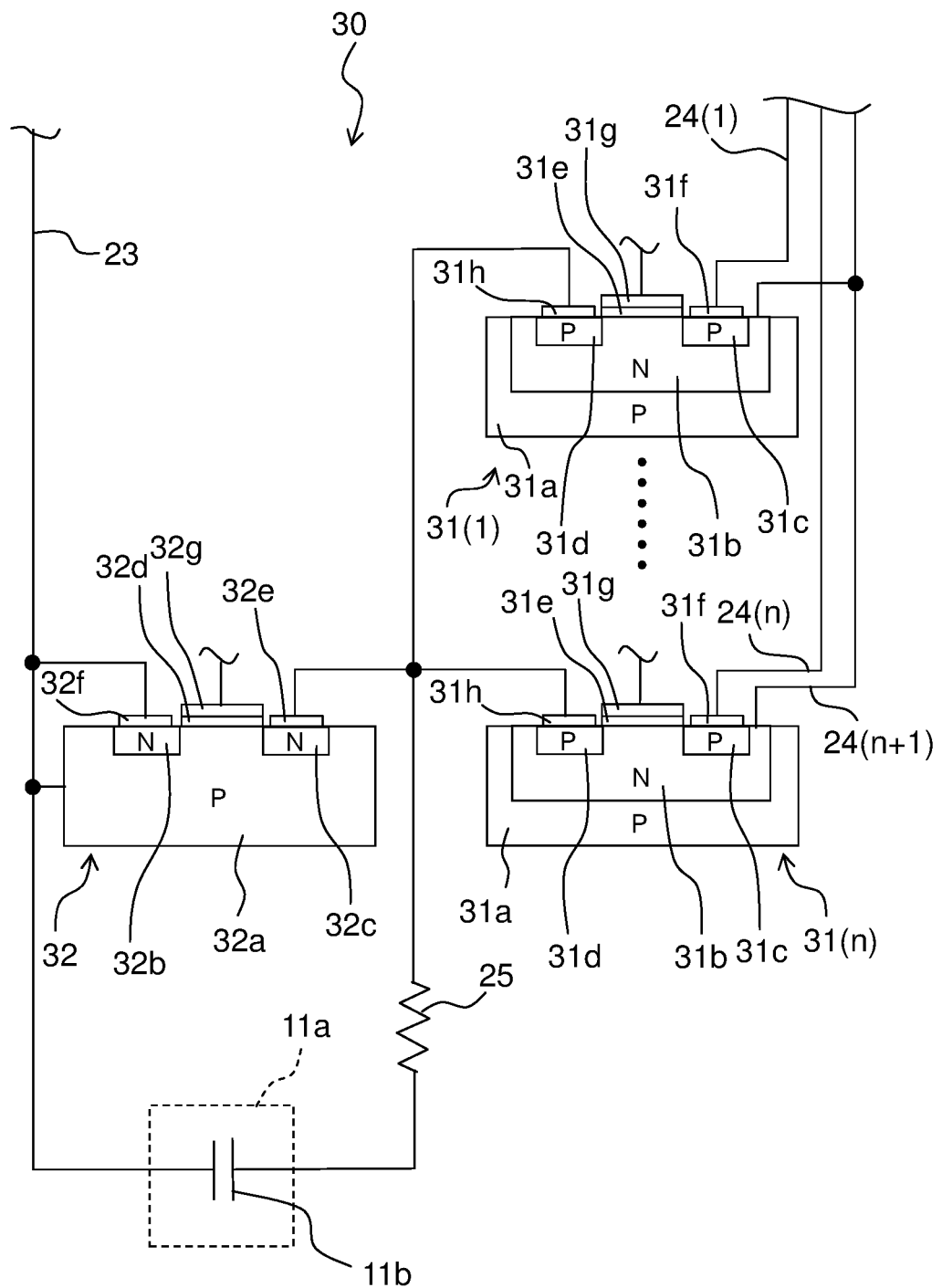
FIG. 7 is a partial circuit diagram schematically depicting a configuration of a CMOS circuit according to a second embodiment.
Figure 8:
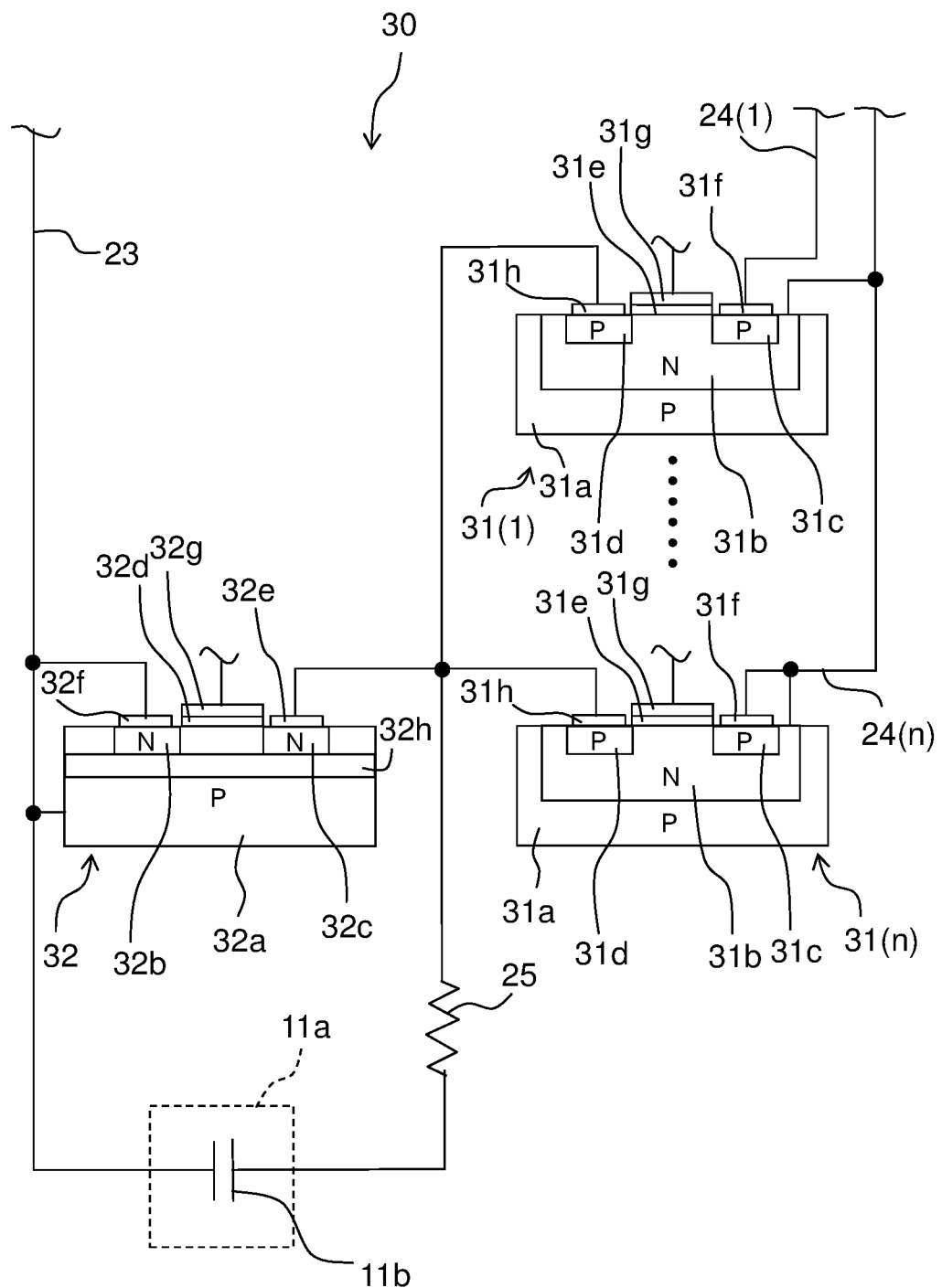
FIG. 8 is a partial circuit diagram schematically depicting a configuration of a CMOS circuit according to a third embodiment.

The ink-jet printer includes a dedicated power source (not depicted) for preventing the reversed current to apply voltage VDD2-(n+1) which is higher than the aforementioned highest voltage (VDD2-n). As depicted in FIG. 7, the dedicated power source is connected, via a (n+1)th power wire 24(n+1), with all of the Nwell areas 31b of the first PMOS transistor 31(1) to the nth PMOS transistor 31(n).

In the second embodiment, because the dedicated power source for preventing the reversed current is prepared to apply the voltage higher than the aforementioned highest voltage, and the dedicated power source is connected to each of the Nwell areas 31b of the PMOS transistors 31, it is possible to prevent the reversed current. That is, because of the voltage higher than the aforementioned highest voltage, it is possible to more reliably prevent the reversed current than the case of applying the highest voltage to the Nwell areas. Further, the dedicated power source is not used for driving of the piezoelectric elements. Therefore, it is possible to apply the stabilized voltage to each of the Nwell areas 31b.

Third Embodiment

An ink-jet printer according to a third embodiment will be explained below based on the accompanying drawings. In the configuration of the third embodiment, the components identical or similar to those in the first embodiment or the second embodiment are each assigned with the same reference sign, and any detailed explanation therefor will be omitted.

In the third embodiment, an embedded oxide film 32h is formed under the channel of the NMOS transistor 32. That is, the NMOS transistor 32 constructs an SOI (Silicon On Insulator) substrate.

In the third embodiment, by using the SOI substrate, even if there is a short distance between the wires, it is still possible to suppress production of parasitic capacitance, and damage is less likely to occur. Further, because it is possible to reduce the parasitic capacitance by using the SOI substrate, it is possible to realize high density layout, chip area miniaturization, operating speed-up, latch-up-free construction, and the like.

[Modification]

Figure 9:
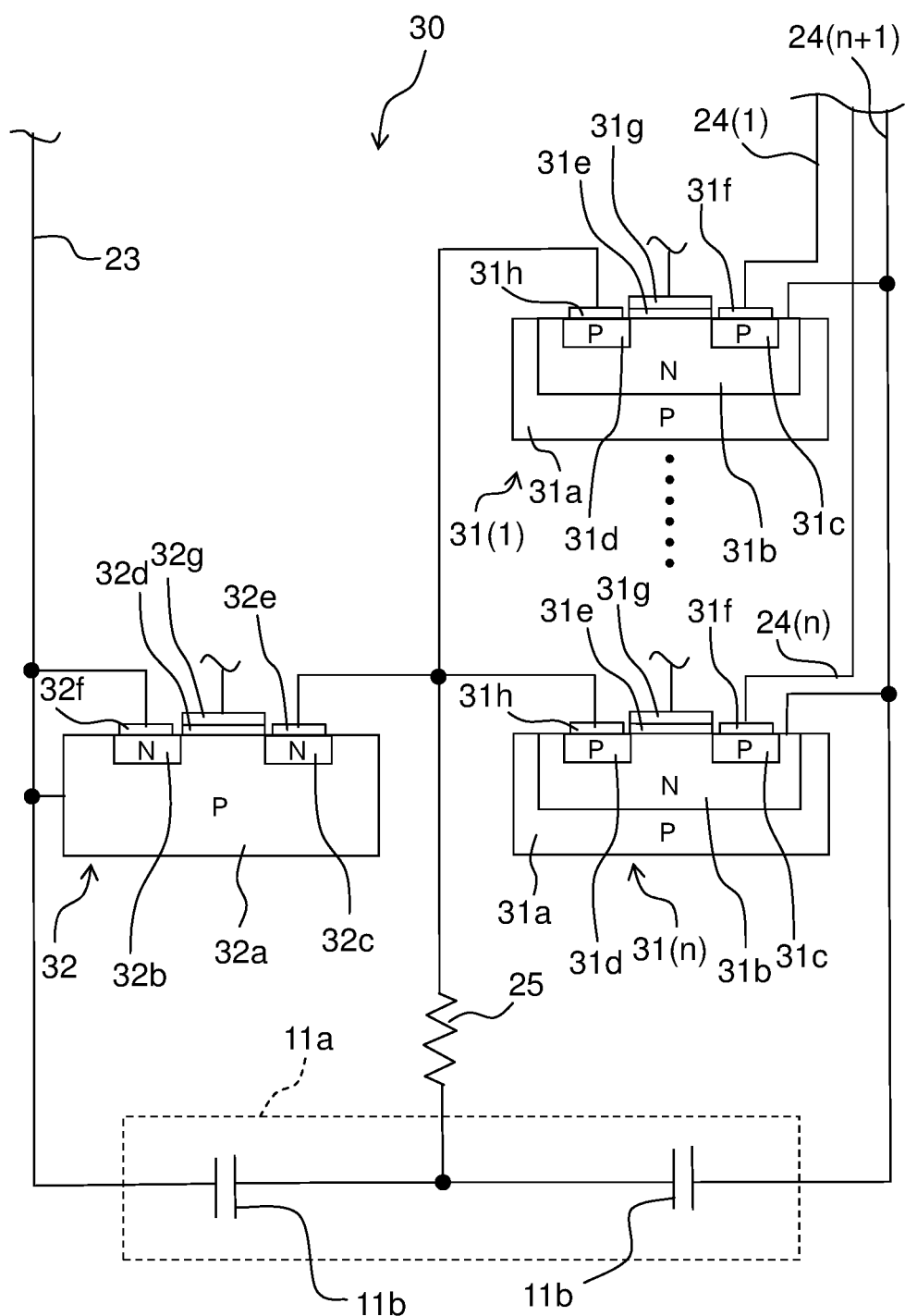
FIG. 9 is a partial circuit diagram schematically depicting a configuration of a CMOS circuit according to a modification.

While the single piezoelectric element 11b is provided in each of the embodiments described above, a plurality of piezoelectric elements 11b may be provided as depicted in FIG. 9. FIG. 9 depicts such a case that another piezoelectric element 11b is connected between one end of the impedance 25, and the power wire 24(n+1) connected commonly to the Nwell areas 31b. Now, the number of piezoelectric elements has increased to two, thereby improving the jetting property. By virtue of this, it is possible to reduce effects of crosstalk.

The embodiments disclosed above should be considered as exemplary in each and every aspect but not as limitary. It is possible to mutually combine the technical characteristics described in the respective embodiments, and the scope of the disclosed embodiments is intended to include all changes and modifications within the scope of the appended claims and include a scope equivalent to the scope of the appended claims.

What is claimed is:

1. An ink-jet head driving circuit comprising:
a first PMOS transistor including a first drain terminal, a first source terminal and a first Nwell area, the first drain terminal being connected to a piezoelectric element for jetting ink from a nozzle;
a second PMOS transistor including a second drain terminal, a second source terminal and a second Nwell area, the second drain terminal being connected to the piezoelectric element;
a third PMOS transistor including a third drain terminal, a third source terminal and a third Nwell area, the third drain terminal being connected to the piezoelectric element; and
an NMOS transistor connected to the first drain terminal of the first PMOS transistor, the second drain terminal of the second PMOS transistor, and the third drain terminal of the third PMOS transistor,
wherein:
the first source terminal of the first PMOS transistor is connected to a first power source;
the second source terminal of the second PMOS transistor is connected to a second power source;
the third source terminal of the third PMOS transistor is connected to a fourth power source;
the first Nwell area of the first PMOS transistor, the second Nwell area of the second PMOS transistor and the third Nwell area of the third PMOS transistor are connected to a third power source; and
voltage of the third power source is higher than the first and second power sources and the voltage of the third power source is higher than voltage of the fourth power source.

2. The ink-jet head driving circuit according to claim 1, wherein the voltage of the first power source is higher than the voltage of the second power source.

3. The ink-jet head driving circuit according to claim 2, wherein voltage difference between the voltages of the third and first power sources are larger than voltage difference between the voltages of the first and second power sources.

4. An ink-jet printer comprising:
the ink-jet head driving circuit according to claim 1;
a head unit including the piezoelectric element and the nozzle associated with the piezoelectric element; and
the first, second, third and fourth power sources.

5. An ink-jet head driving circuit comprising:
a first PMOS transistor including a first drain terminal, a first source terminal and a first Nwell area, the first drain terminal being connected to a piezoelectric element for jetting ink from a nozzle;
a second PMOS transistor including a second drain terminal, a second source terminal and a second Nwell area, the second drain terminal being connected to the piezoelectric element; and
an NMOS transistor connected to the first drain terminal of the first PMOS transistor and the second drain terminal of the second PMOS transistor,
wherein:

the first source terminal of the first PMOS transistor is connected to a first power source;
the second source terminal of the second PMOS transistor is connected to a second power source;
both the first Nwell area of the first PMOS transistor and the second Nwell area of the second PMOS transistor are connected to a third power source; and
voltage of the third power source is higher than the first and second power sources,
wherein the voltage of the first power source is higher than the voltage of the second power source, and
wherein voltage difference between the voltages of the third and first power sources are larger than voltage difference between the voltages of the first and second power sources.

\* \* \* \* \*

UNITED STATES PATENT AND TRADEMARK OFFICE
CERTIFICATE OF CORRECTION

PATENT NO. : 10,933,631 B2
APPLICATION NO. : 16/397527
DATED : March 2, 2021
INVENTOR(S) : Toru Yamashita Page 1 of 1

It is certified that error appears in the above-identified patent and that said Letters Patent is hereby corrected as shown below:

In the Claims

Column 8, Claim 1, Line 39 should read:
voltage of the third power source is higher than voltages of the first Column 9, Claim 5, Line 8 should read:
voltage of the third power source is higher than voltages of the first Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*